United States Patent
Tomura et al.

(10) Patent No.: US 12,112,954 B2
(45) Date of Patent: Oct. 8, 2024

(54) ETCHING METHOD, SUBSTRATE PROCESSING APPARATUS, AND SUBSTRATE PROCESSING SYSTEM

(71) Applicant: TOKYO ELECTRON LIMITED, Tokyo (JP)

(72) Inventors: Maju Tomura, Miyagi (JP); Tomohiko Niizeki, Miyagi (JP); Takayuki Katsunuma, Miyagi (JP); Hironari Sasagawa, Miyagi (JP); Yuta Nakane, Miyagi (JP); Shinya Ishikawa, Miyagi (JP); Kenta Ono, Miyagi (JP); Sho Kumakura, Miyagi (JP); Yusuke Takino, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 364 days.

(21) Appl. No.: 17/160,780

(22) Filed: Jan. 28, 2021

(65) Prior Publication Data

US 2021/0233778 A1    Jul. 29, 2021

(30) Foreign Application Priority Data

Jan. 29, 2020  (JP) .................................. 2020-012240
Jun. 10, 2020  (JP) .................................. 2020-101012

(51) Int. Cl.
H01L 21/311    (2006.01)
H01L 21/3205   (2006.01)
H01L 21/3213   (2006.01)

(52) U.S. Cl.
CPC .. *H01L 21/31144* (2013.01); *H01L 21/31116* (2013.01); *H01L 21/31138* (2013.01); *H01L 21/32055* (2013.01); *H01L 21/32137* (2013.01); *H01L 21/32139* (2013.01)

(58) Field of Classification Search
None
See application file for complete search history.

(56) References Cited

U.S. PATENT DOCUMENTS

| | | | |
|---|---|---|---|
| 9,735,027 B2* | 8/2017 | Lee | H01L 21/31138 |
| 10,923,360 B2* | 2/2021 | Katsunuma | H01L 21/31116 |
| 11,651,971 B2* | 5/2023 | Ono | H01L 21/32137 |
| | | | 438/706 |
| 2016/0086817 A1* | 3/2016 | Kitagaito | H01L 21/31144 |
| | | | 156/345.24 |
| 2016/0343580 A1* | 11/2016 | Hudson | H01L 21/67069 |
| 2019/0198350 A1* | 6/2019 | Tabata | H01L 21/02164 |
| 2022/0399205 A1* | 12/2022 | Wang | H01L 21/32139 |

FOREIGN PATENT DOCUMENTS

| | | |
|---|---|---|
| JP | 2004-335526 A | 11/2004 |
| JP | 2012-204668 A | 10/2012 |
| JP | 2018-093189 A | 6/2018 |
| JP | 2019-207911 A | 12/2019 |

\* cited by examiner

Primary Examiner — Allan W. Olsen
(74) Attorney, Agent, or Firm — XSENSUS LLP

(57) ABSTRACT

An etching method includes forming a film on a surface of a substrate having a region to be etched and a mask. The mask is provided on the region and includes an opening that partially exposes the region. The film is made of the same material as that of the region. The etching method further includes etching the region.

20 Claims, 10 Drawing Sheets

ETCHING METHOD, SUBSTRATE PROCESSING APPARATUS, AND SUBSTRATE PROCESSING SYSTEM

CROSS-REFERENCE TO RELATED APPLICATIONS

This application is based on and claims priority from Japanese Patent Application Nos. 2020-012240 and 2020-101012, filed on Jan. 29, 2020 and Jun. 10, 2020, respectively, with the Japan Patent Office, the disclosures of which are incorporated herein in their entireties by reference.

TECHNICAL FIELD

Exemplary embodiments disclosed herein relate to an etching method, a substrate processing apparatus, and a substrate processing system.

BACKGROUND

Plasma etching is used to form an opening in a film formed on a substrate. Japanese Patent Laid-Open Publication No. 2012-204668 discloses a technique in which a protective film containing silicon is formed on a side wall that defines an opening formed by plasma etching of an organic film, and plasma etching of the organic film is further performed.

SUMMARY

In an exemplary embodiment, an etching method is provided. The etching method includes forming a film on a surface of a substrate. The substrate includes a region to be etched and a mask. The mask is provided on the region of the substrate and includes an opening that partially exposes the region. The film is made of the same material as that of the region of the substrate. The etching method further includes etching the region of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
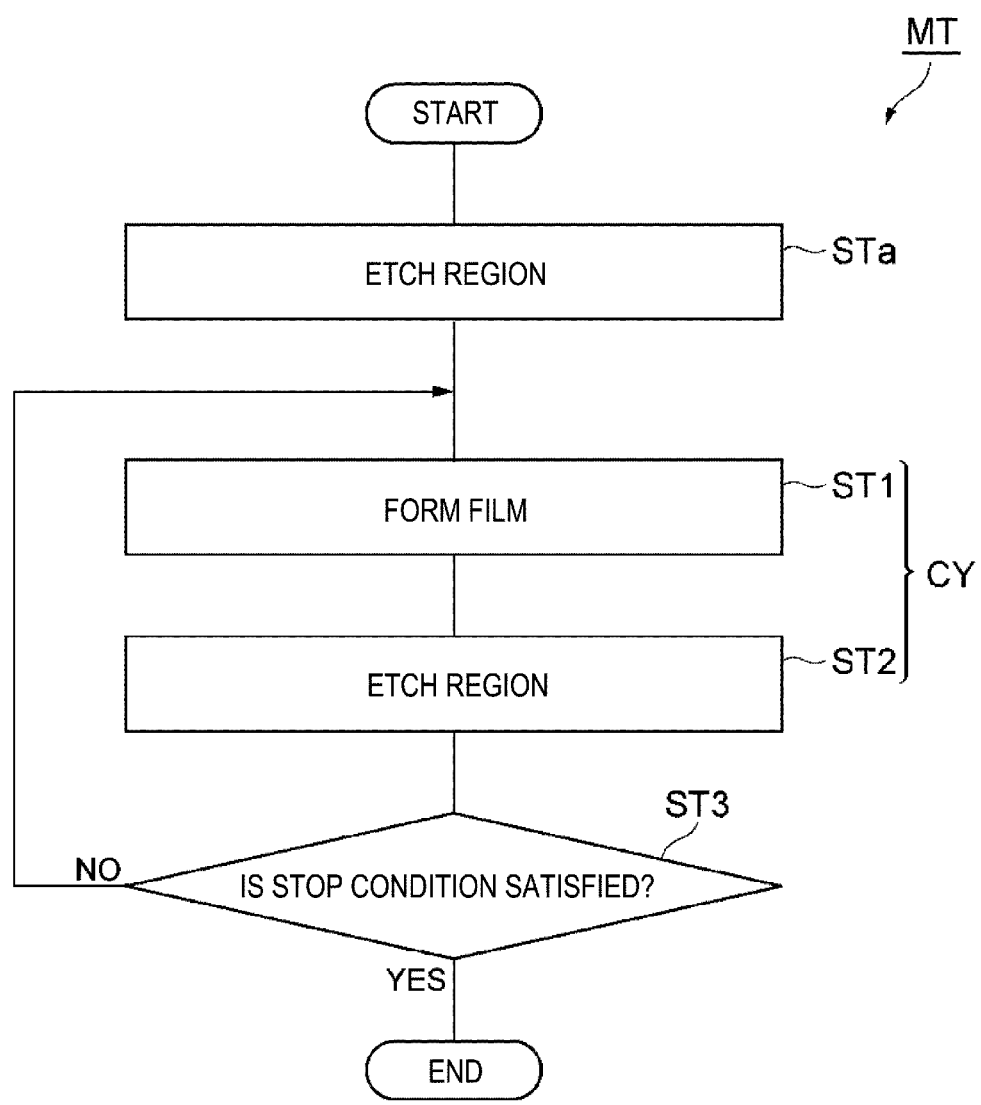
FIG. 1 is a flowchart illustrating an etching method according to an embodiment.

In the following detailed description, reference is made to the accompanying drawing, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, an etching method is provided. The etching method includes (a) forming a film on a surface of a substrate. The substrate includes a region to be etched and a mask. The mask is provided on the region of the substrate and includes an opening that partially exposes the region. The film is made of the same material as that of the region of the substrate. The etching method further includes (b) etching the region of the substrate. In (b), the region may be etched by plasma etching.

In the embodiment, the film formed on the substrate protects the mask at the beginning of etching the region. Therefore, substances released when the mask is etched may be suppressed from being reattached to the mask to prevent the openings being blocked. Alternatively, when a gas forming deposits on the mask is used as an etching gas to protect the mask, excess deposits may be suppressed from blocking the openings.

In an embodiment, in (b), an etching rate of the film may be equal to or higher than an etching rate of the region of the substrate, or equal to or lower than the etching rate of the region.

The region of the substrate may be made of an organic material. The region of the substrate may be made of silicon oxide or silicon nitride. The region of the substrate may include a plurality of layers made of two or more materials selected from silicon oxide, silicon nitride, and polycrystalline silicon, respectively. The region of the substrate may be made of silicon and/or germanium. When the region of the substrate is made of silicon and/or germanium, the film may be amorphous silicon.

In an embodiment, the etching method may further include (c) partially etching the region. The film may be formed on a side wall surface formed in (c), and a depth of an opening formed in the region in (c) may be increased in (b).

In an embodiment, (a) may include forming a precursor layer on the substrate by supplying a first gas to the substrate; and forming the film from the precursor layer by supplying a second gas to the precursor layer or by activating the precursor layer. In an embodiment, the film may be formed using chemical species from plasma generated from the second gas. In another embodiment, the film may be formed by CVD. The CVD may be CVD using plasma, heat, or light. In various embodiments, the film may be formed such that a thickness thereof decreases along a depth in the substrate from the top edge of the substrate.

In an embodiment, in the etching method, the region of the substrate may be formed with an opening having an aspect ratio of 10 or more. In an embodiment, a width of the opening included in the mask may be 100 nm or less.

In an embodiment, forming the film and etching the region may be alternately repeated.

In another embodiment, a substrate processing apparatus is provided. The substrate processing apparatus includes a chamber, a gas supply, and a controller. The gas supply unit is configured to supply a gas into the chamber. The controller controls the gas supply to supply the gas into the chamber such that a film is formed on a substrate. The substrate includes a region to be etched and a mask. The mask is provided on the region of the substrate and includes an opening. The film is made of the same material as that of the region of the substrate. The controller controls the gas supply to supply the gas into the chamber such that the region of the substrate is etched.

In still another embodiment, a substrate processing system is provided. The substrate processing system includes a film forming apparatus and a substrate processing apparatus. The film forming apparatus is configured to form a film on a substrate. The substrate includes a region to be etched and a mask. The mask is provided on the region of the substrate and includes an opening. The film is made of the same material as that of the region of the substrate. The substrate processing apparatus is configured to etch the region of the substrate.

Hereinafter, various embodiments will be described in detail with reference to the drawings. Meanwhile, in the respective drawings, the same or corresponding parts will be denoted by the same symbols.

Figure 2:
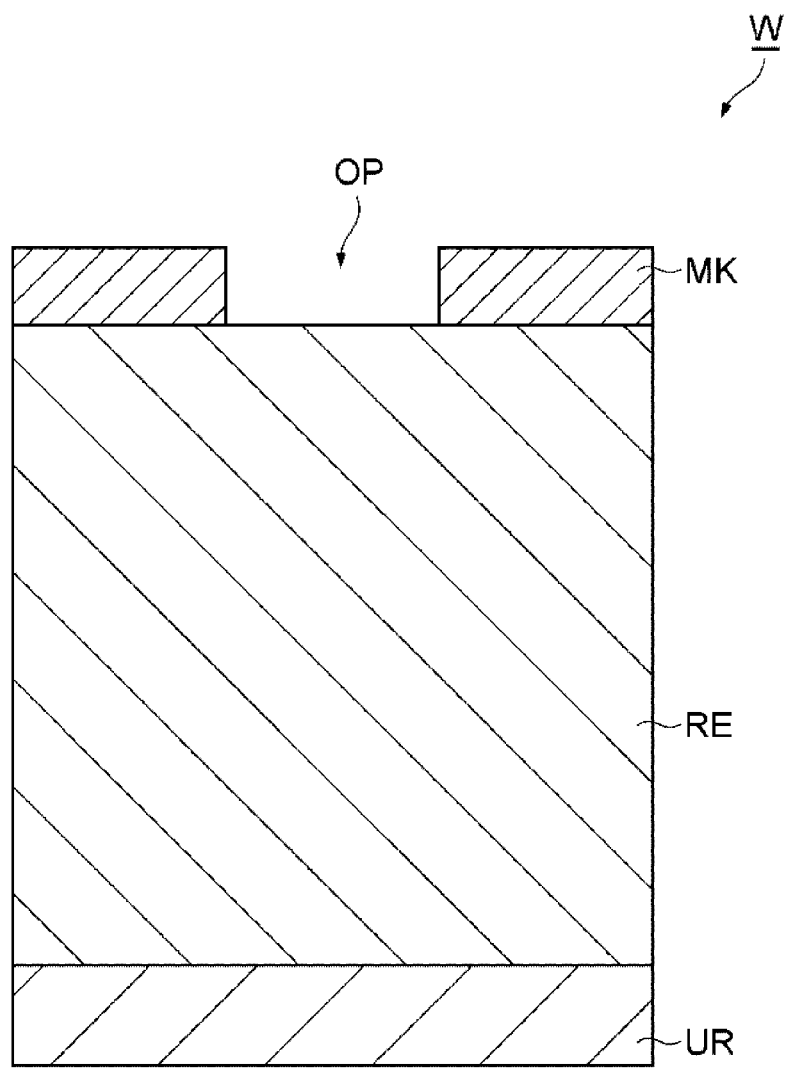
FIG. 2 is a partially enlarged cross-sectional view illustrating an exemplary substrate.

FIG. 1 is a flowchart illustrating an etching method according to an embodiment. The etching method illustrated in FIG. 1 (hereinafter, referred to as a "method MT") is performed to etch a region in a substrate. FIG. 2 is a partially enlarged cross-sectional view illustrating an exemplary substrate. The substrate W illustrated in FIG. 2 includes a region RE and a mask MK. The substrate W may further include an underlying region UR.

The region RE is a region to be etched by the method MT. In the substrate W illustrated in FIG. 2, the region RE is provided on the underlying region UR. The mask MK is provided on the region RE. The mask MK is patterned. That is, the mask MK provides one or more openings OP that partially expose the region RE. The width of the opening OP provided by the mask MK may be, for example, 100 nm or less. The region RE may be made of any material. The mask MK may be made of any material as long as the region RE is selectively etched with respect to the mask MK in step ST2 described later.

In a first example of the substrate W, the region RE is made of an organic material. In a second example of the substrate W, the region RE is made of silicon oxide. In a third example of the substrate W, the region RE is made of silicon nitride. In a fourth example of the substrate W, the region RE is made of silicon (e.g., polycrystalline silicon) and/or germanium. In a fifth example of the substrate W, the region RE includes one or more silicon oxide films and one or more silicon nitride films which are alternately stacked. In the fifth example of the substrate W, the region RE may include a single silicon oxide film and a single silicon nitride film. In the fifth example of the substrate W, the single silicon nitride film may be provided between the single silicon oxide film and the mask MK. In a sixth example of the substrate W, the region RE includes one or more silicon oxide films and one or more polycrystalline silicon films which are alternately stacked. In a seventh example of the substrate W, the region RE is made of a stack including one or more silicon oxide films, one or more silicon nitride films, and one or more polycrystalline silicon films. In an eighth example of the substrate W, the region RE is made of a low-dielectric material. In the eighth example of the substrate W, the region RE includes silicon, carbon, oxygen, and hydrogen. That is, in the eighth example of the substrate W, a film EF may be a SiCOH film.

In the first example of the substrate W, the mask MK is made of SiON, a metal-containing material, or a silicon-containing material. The mask MK made of a silicon-containing material may be formed as, for example, a silicon-containing anti-reflection film. In the second, third, fifth, sixth, and seventh examples of the substrate W, the mask MK is made of silicon, a carbon-containing material, or a metal-containing material. In the fourth example of the substrate W, the mask MK is made of silicon oxide. In the eighth example of the substrate W, the mask MK is made of a metal-containing material such as a tungsten-containing material or a titanium-containing material. In the eighth example of the substrate W, the mask MK may be made of an organic material (e.g., photoresist), silicon oxide, or polycrystalline silicon. The silicon contained in the mask MK is, for example, polycrystalline silicon or amorphous silicon. The carbon-containing material contained in the mask MK is, for example, amorphous carbon or a spin-on-carbon material. The metal-containing material contained in the mask MK is, for example, tungsten, tungsten carbide, or titanium nitride.

Figure 3:
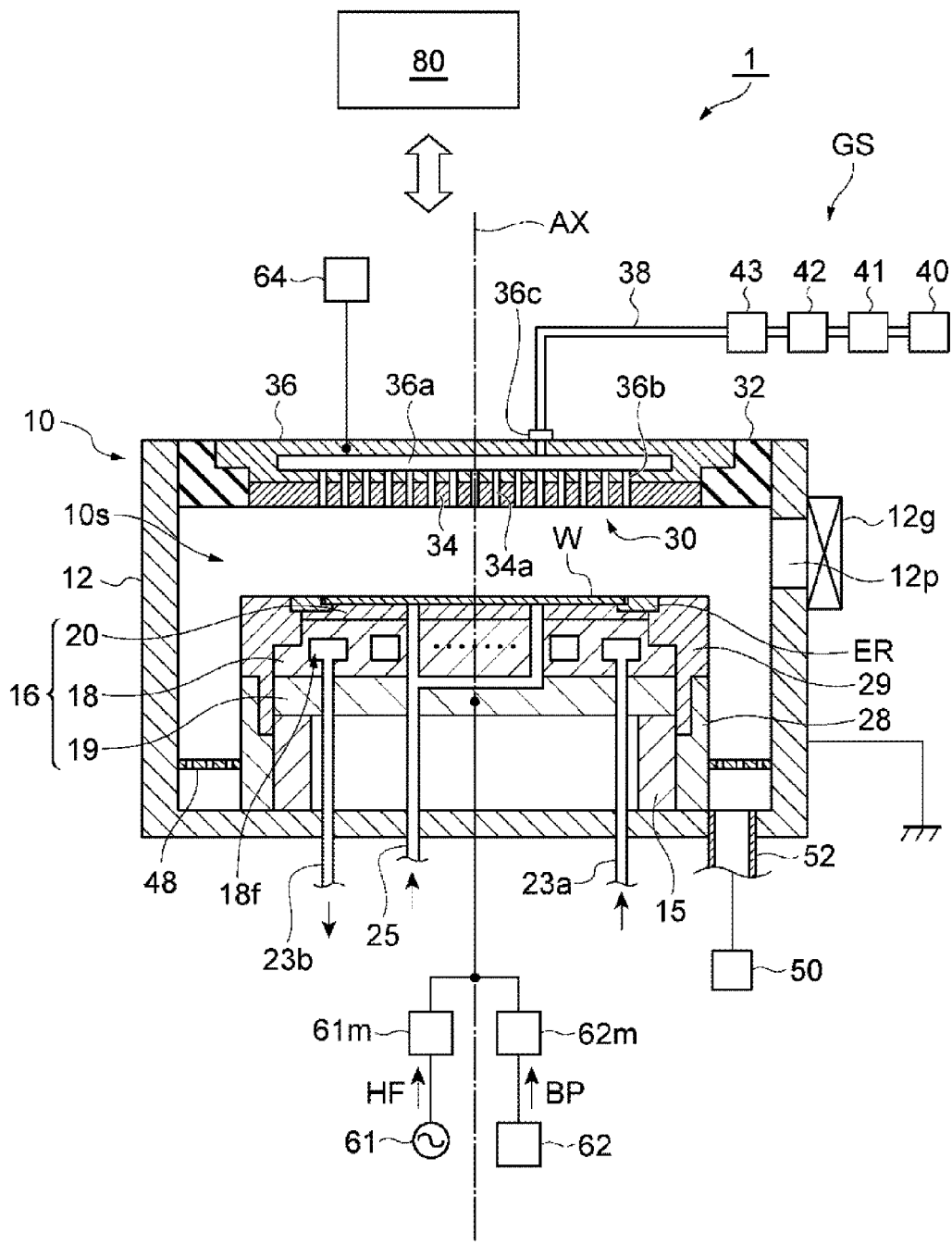
FIG. 3 is a schematic view illustrating a substrate processing apparatus according to an embodiment.

In an embodiment, the method MT is performed using a substrate processing apparatus. FIG. 3 is a schematic view illustrating a substrate processing apparatus according to an embodiment. The substrate processing apparatus illustrated in FIG. 3 is a capacitively coupled plasma processing apparatus 1.

The plasma processing apparatus 1 includes a chamber 10. The chamber 10 provides an internal space 10s therein. The central axis of the chamber 10 is an axis AX that extends in the vertical direction. In the embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having corrosion resistance is provided on an inner wall surface of the chamber body 12. The film having corrosion resistance may be a film made of a ceramic such as aluminum oxide or yttrium oxide.

A passage 12p is formed at a side wall of the chamber body 12. The substrate W passes through the passage 12p when being transferred between the internal space 10s and the outside of the chamber 10. The passage 12p may be opened/closed by a gate valve 12g. The gate valve 12g is provided along the side wall of the chamber body 12.

The plasma processing apparatus 1 further includes a substrate supporter 16. The substrate supporter 16 is configured to support the substrate W in the chamber 10. The substrate W has a substantially disc shape. The substrate supporter 16 is supported by a support 15. The support 15 extends upward from the bottom of the chamber body 12. The support 15 has a substantially cylindrical shape. The support 15 is made of an insulating material such as quartz.

The substrate supporter 16 includes a lower electrode 18 and an electrostatic chuck 20. The substrate supporter 16 may further include an electrode plate 19. The electrode plate 19 is made of a conductive material such as aluminum. The electrode plate 19 has a substantially disc shape, and the central axis thereof is the axis AX. The lower electrode 18 is provided on the electrode plate 19. The lower electrode 18 is made of a conductive material such as aluminum. The lower electrode 18 has a substantially disc shape, and the central axis thereof is the axis AX. The lower electrode 18 is electrically connected to the electrode plate 19.

A flow path 18$f$ is provided in the lower electrode 18. The flow path 18$f$ is a flow path for a heat exchange medium (e.g., coolant). The flow path 18$f$ is connected with a heat exchange medium supply device (e.g., chiller unit). The supply device is provided outside the chamber 10. A heat exchange medium is supplied from the supply device to the flow path 18$f$ through a pipe 23$a$. The heat exchange medium supplied to the flow path 18$f$ returns to the supply device through a pipe 23$b$. The heat exchange medium supply device constitutes a temperature control mechanism of the plasma processing apparatus 1.

Figure 4:
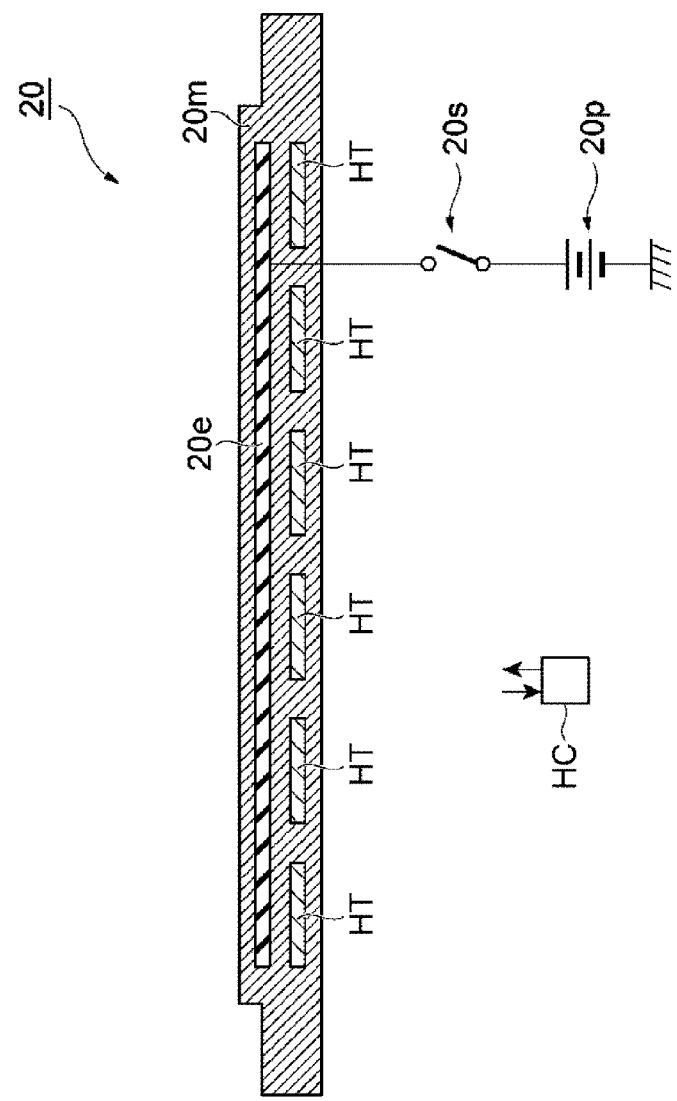
FIG. 4 is an enlarged cross-sectional view of an electrostatic chuck in the substrate processing apparatus according to the embodiment.

FIG. 4 is an enlarged cross-sectional view of an electrostatic chuck in the substrate processing apparatus according to the embodiment. Hereinafter, reference will be made to FIGS. 3 and 4. The electrostatic chuck 20 is provided on the lower electrode 18. The substrate W is placed on the upper surface of the electrostatic chuck 20. The electrostatic chuck 20 has a body 20$m$ and an electrode 20$e$. The body 20$m$ is made of a dielectric. The electrostatic chuck 20 and the body 20$m$ have a substantially disc shape, and the central axes thereof coincide with the axis AX. The electrode 20$e$ is a film-shaped electrode and provided in the body 20$m$. The electrode 20$e$ is connected to a DC power supply 20$p$ via a switch 20$s$. When a voltage is applied from the DC power supply 20$p$ to the electrode 20$e$, an electrostatic attractive force is generated between the electrostatic chuck 20 and the substrate W. Due to the generated electrostatic attractive force, the substrate W is attracted to the electrostatic chuck 20 and held by the electrostatic chuck 20.

The substrate supporter 16 may include one or more heaters HT. Each of the one or more heaters HT may be a resistance heating element. The plasma processing apparatus 1 may further include a heater controller HC. Each of the one or more heaters HT generates heat according to the electric power individually applied from the heater controller HC. As a result, the temperature of the substrate W on the substrate supporter 16 is adjusted. The one or more heaters HT constitute a temperature control mechanism of the plasma processing apparatus 1. In an embodiment, the substrate supporter 16 includes a plurality of heaters HT. The plurality of heaters HT may be provided in the electrostatic chuck 20.

An edge ring ER is disposed on a periphery of the substrate supporter 16 to surround an edge of the substrate W. The substrate W is disposed on the electrostatic chuck 20 and in a region surrounded by the edge ring ER. The edge ring ER is used to improve the in-plane uniformity of the plasma processing on the substrate W. The edge ring ER may be made of silicon, silicon carbide, or quartz.

The plasma processing apparatus 1 may further include a gas supply line 25. The gas supply line 25 supplies a heat transfer gas (e.g., He gas) from a gas supply mechanism to a gap between the upper surface of the electrostatic chuck 20 and the rear surface (lower surface) of the substrate W.

The plasma processing apparatus 1 may further include a cylindrical portion 28 and an insulating portion 29. The cylindrical portion 28 extends upward from the bottom of the chamber body 12. The cylindrical portion 28 extends along the outer periphery of the support 15. The cylindrical portion 28 is made of a conductive material and has a substantially cylindrical shape. The cylindrical portion 28 is electrically grounded. The insulating portion 29 is provided on the cylindrical portion 28. The insulating portion 29 is made of an insulating material. The insulating portion 29 is made of a ceramic such as, for example, quartz. The insulating portion 29 has a substantially cylindrical shape. The insulating portion 29 extends along the outer periphery of the electrode plate 19, the outer periphery of the lower electrode 18, and the outer periphery of the electrostatic chuck 20.

The plasma processing apparatus 1 further includes an upper electrode 30. The upper electrode 30 is provided above the substrate supporter 16. The upper electrode 30 is supported in the upper portion of the chamber body 12 through a member 32. The member 32 is made of an insulating material. The upper electrode 30 and the member 32 close the upper opening of the chamber body 12.

The upper electrode 30 may include a top plate 34 and a support 36. The lower surface of the top plate 34 is a lower surface on the internal space 10$s$ side, and defines the internal space 10$s$. The top plate 34 may be made of a low-resistance conductor or a semiconductor that generates low Joule heat. In an embodiment, the top plate 34 is made of silicon. A plurality of gas ejection holes 34$a$ are formed in the top plate 34. The plurality of gas ejection holes 34$a$ penetrate the top plate 34 in the plate thickness direction.

The support 36 detachably supports the top plate 34. The support 36 is made of a conductive material such as aluminum. A gas diffusion chamber 36$a$ is provided inside the support 36. A plurality of gas holes 36$b$ are formed in the support 36. The plurality of gas holes 36$b$ extend downward from the gas diffusion chamber 36$a$. The plurality of gas holes 36$b$ communicate with the plurality of gas ejection holes 34$a$, respectively. A gas introduction port 36$c$ is formed in the support 36. The gas introduction port 36$c$ is connected to the gas diffusion chamber 36$a$. The gas introduction port 36$c$ is connected with a gas supply pipe 38.

The gas supply pipe 38 is connected with a gas source group 40 via a valve group 41, a flow rate controller group 42, and a valve group 43. The gas source group 40, the valve group 41, the flow rate controller group 42, and the valve group 43 constitute a gas supply GS. The gas source group 40 includes a plurality of gas sources. The plurality of gas sources of the gas source group 40 include a plurality of gas sources which are used in the method MT. When one or more gases used in the method MT are formed from liquid, the plurality of gas sources includes one or more gas sources each having a liquid source and a vaporizer. Each of the valve group 41 and the valve group 43 includes a plurality of opening/closing valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the opening/closing valves corresponding to the valve group 41, the flow rate controllers corresponding to the flow rate controller group 42, and the opening/closing valves corresponding to the valve group 43.

The plasma processing apparatus 1 may further include a baffle member 48. The baffle member 48 is provided between the cylindrical portion 28 and a side wall of the chamber body 12. The baffle member 48 may be a plate-shaped member. The baffle plate 48 is formed by, for example, forming a corrosion-resistant film on the surface of a member made of aluminum. The corrosion-resistant film may be a film made of a ceramic such as yttrium oxide. The baffle member 48 has a plurality of through-holes formed therein. An exhaust port 12e is provided at the lower side of the baffle member 48 and at the bottom of the chamber body 12. The exhaust port 12e is connected with an exhaust device 50 through an exhaust pipe 52. The exhaust device 50 includes a vacuum pump such as a pressure adjusting valve and a turbo molecular pump.

The plasma processing apparatus 1 further includes a radio-frequency power supply 61. The radio-frequency power supply 61 generates a radio-frequency power HF for plasma generation. The radio-frequency power HF has a first frequency. The first frequency is, for example, a frequency within a range of 27 MHz to 100 MHz. The radio-frequency power supply 61 is connected to the lower electrode 18 through a matcher 61m and the electrode plate 19 to supply the radio-frequency power HF to the lower electrode 18. The matcher 61m includes a matching circuit. The matching circuit of the matcher 61m has a variable impedance. The impedance of the matching circuit of the matcher 61m is adjusted so as to reduce the reflection from the load of the radio-frequency power supply 61. The radio-frequency power supply 61 may not be electrically connected to the lower electrode 18, and may be connected to the upper electrode 30 through the matcher 61m. The radio-frequency power supply 61 constitutes an exemplary plasma generator.

The plasma processing apparatus 1 further includes a bias power supply 62. The bias power supply 62 generates a bias power BP which is used for drawing ions into the substrate W. The bias power supply 62 is connected to the lower electrode 18 via the electrode plate 19.

In an embodiment, the bias power supply 62 may be a radio-frequency power supply that generates a radio-frequency power LF as a bias power BP. The radio-frequency power LF has a second frequency suitable for drawing ions in the plasma into the substrate W. The second frequency may be lower than the first frequency. The second frequency is, for example, a frequency within a range of 400 kHz to 13.56 MHz. In the embodiment, the bias power supply 62 is connected to the lower electrode 18 via a matcher 62m and the electrode plate 19. The matcher 62m includes a matching circuit. The matching circuit of the matcher 62m has a variable impedance. The impedance of the matching circuit of the matcher 62m is adjusted so as to reduce the reflection from the load of the bias power supply 62.

The plasma may be generated using only one of the radio-frequency power supply 61 and the bias power supply 62. In this case, one power supply constitutes an exemplary plasma generator. In this case, the frequency of the radio-frequency power supplied from the one power supply may be a frequency larger than 13.56 MHz, for example, 40 MHz. In this case, the plasma processing apparatus does not have to include another power supply of the radio-frequency power supply 61 and the bias power supply 62.

In another embodiment, the bias power supply 62 may be a DC power supply device that intermittently or periodically applies a pulse of a negative DC voltage as the bias power BP to the lower electrode 18. For example, the bias power supply 62 may periodically apply a negative DC voltage pulse to the lower electrode 18 at a cycle defined by a frequency in a range of 1 kHz to 1 MHz.

In an embodiment, the plasma processing apparatus 1 may further include a DC power supply device 64. The DC power supply device 64 is connected to the upper electrode 30. The DC power supply device 64 is configured to supply a DC voltage, for example, negative DC voltage to the upper electrode 30. The DC power supply device 64 may intermittently or periodically apply a pulse of DC voltage to the upper electrode 30.

When plasma is generated in the plasma processing apparatus 1, a gas is supplied from the gas supply GS to the internal space 10s. Further, a radio-frequency electric field is generated between the upper electrode 30 and the lower electrode 18 by supplying the radio-frequency power. The gas is excited by the generated radio-frequency electric field. As a result, plasma is generated in the chamber 10.

The plasma processing apparatus 1 further includes a controller 80. The controller 80 is a computer including, for example, a processor, a storage device, an input device, and a display device, and controls respective parts of the plasma processing apparatus 1. Specifically, the controller 80 executes a control program stored in the storage device and controls respective parts of the plasma processing apparatus 1 based on a recipe data stored in the storage device. A process designated by the recipe data is executed in the plasma processing apparatus 1 by the control of the controller 80. The method MT may be performed in the plasma processing apparatus 1 by the control of the respective parts of the plasma processing apparatus 1 by the controller 80.

Referring back to FIG. 1, the method MT will be described in detail. In the following descriptions, the method MT will be described by taking as an example the case where the substrate W illustrated in FIG. 2 is processed by using the plasma processing apparatus 1. In the method MT, another substrate processing apparatus may be used. In the method MT, another substrate may be processed.

The method MT is performed in a state where the substrate W is placed on the substrate supporter 16. The method MT may be performed while maintaining a decompressed environment in the internal space 10s of the chamber 10 and without removing the substrate W from the internal space 10s. In an embodiment, the method MT may be started in step STa. In step STa, the region RE is partially etched. The region RE may be etched using plasma.

In step STa, plasma Pa is generated from a processing gas in the chamber 10. When the substrate W of the first example described above is processed, the processing gas used in step STa may contain an oxygen-containing gas. The oxygen-containing gas may include one or more of $O_2$ gas, COS gas, $SO_2$ gas, $CO_2$ gas, and CO gas. When the substrate W of the second or eighth example described above is processed, the processing gas used in step STa may contain a fluorocarbon gas. When the substrate W of the third example described above is processed, the processing gas used in step STa may contain a hydrofluorocarbon gas. When the substrate W of the fourth example described above is processed, the processing gas used in step STa may contain a halogen-containing gas. The halogen-containing gas may include one or more of, for example, $CF_4$ gas, $Cl_2$ gas, HBr gas, and HI gas. When the substrate W of the fifth, sixth, or seventh example described above is processed, the processing gas used in step STa may contain one or more of the above-mentioned fluorocarbon gas and hydrofluorocarbon gas. In any case where the substrate W of any example is processed, the processing gas used in step STa may further contain an inert gas (e.g., a rare gas).

Figure 5A:
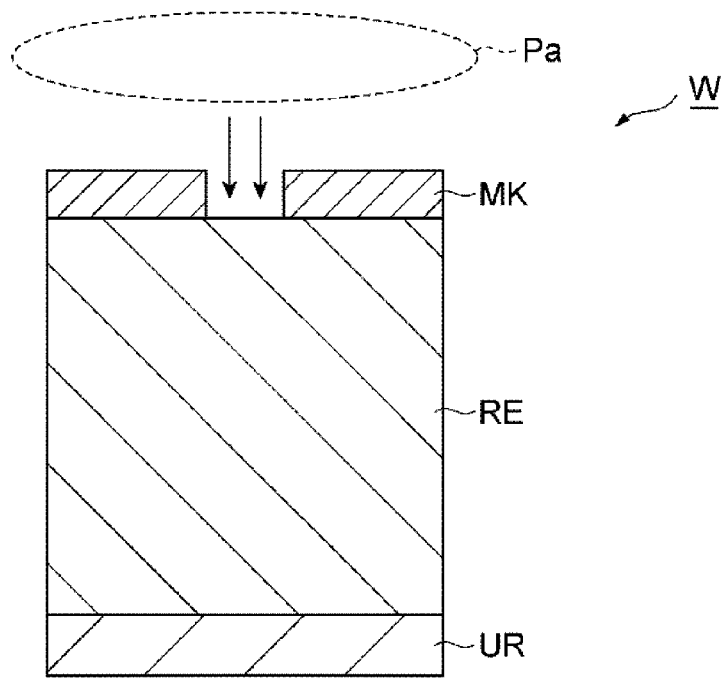
FIG. 5A is a view for explaining step STa of the etching method illustrated in FIG. 1.
Figure 5B:
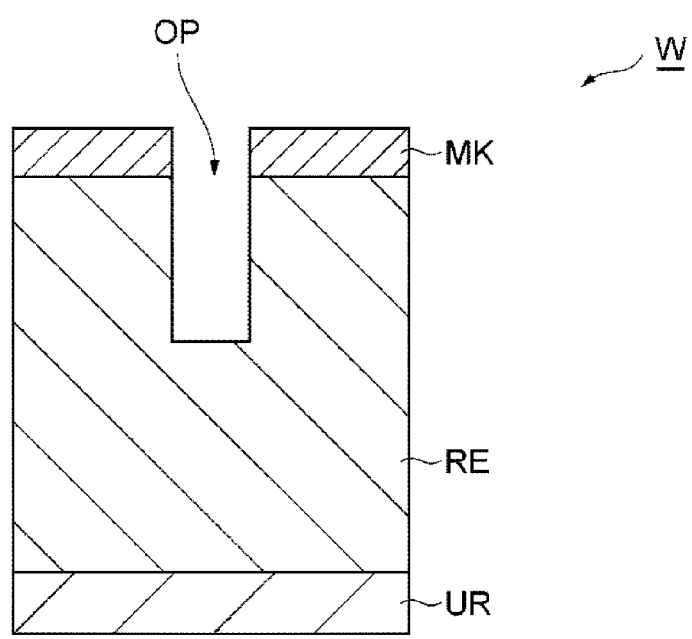
FIG. 5B is a partially enlarged cross-sectional view of the exemplary substrate after step STa is performed.

FIG. 5A is a view for explaining step STa of the etching method illustrated in FIG. 1, and FIG. 5B is a partially enlarged cross-sectional view of the exemplary substrate after step STa is performed. In step STa, as illustrated in FIG. 5A, chemical species from the plasma Pa are supplied to the substrate W, so that the region RE is partially etched by the chemical species. In step STa, the region RE is etched to a position between an upper surface of the region RE and a lower surface of the region RE. The lower surface of the region RE is a surface of the region RE that comes into contact with the underlying region UR. The upper surface of the region RE is a surface of the region RE exposed from the opening of the mask MK. When step STa is performed, the opening OP is formed so as to extend from the mask MK into the region RE, as illustrated in FIG. 5B.

In step STa, the controller 80 controls the exhaust device 50 to set the pressure of the gas in the chamber 10 to a designated pressure. In step STa, the controller 80 controls the gas supply GS to supply the processing gas into the chamber 10. In step STa, the controller 80 controls the plasma generator to generate plasma from the processing gas. In step STa in an embodiment, the controller 80 controls the radio-frequency power supply 61 and the bias power supply 62 to supply the radio-frequency power HF and the bias power BP. In step STa, only one of the radio-frequency power HF and the radio-frequency power LF may be supplied to generate the plasma.

The method MT may not include step STa. In this case, an opening OP is provided in advance in the region RE of the substrate to which the method MT is applied. Alternatively, when the method MT does not include step STa, steps ST1 and ST2 are applied to the substrate W illustrated in FIG. 2.

Figure 7A:
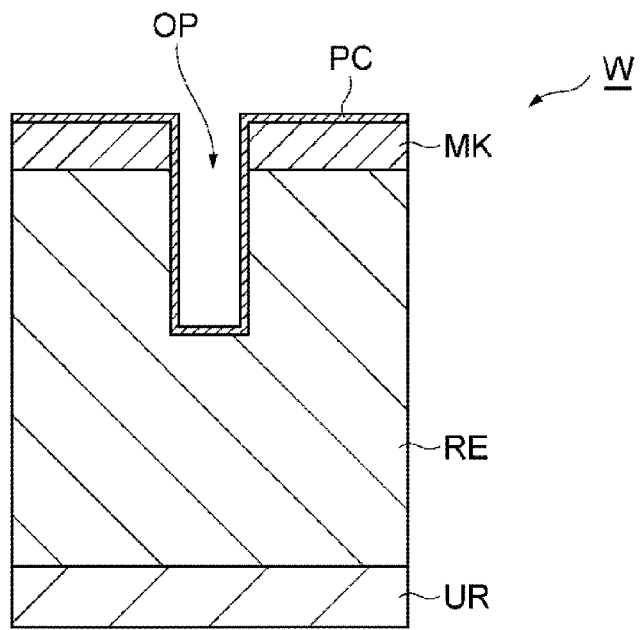
FIG. 7A is a partially enlarged cross-sectional view of the exemplary substrate after a precursor layer is formed.
Figure 7B:
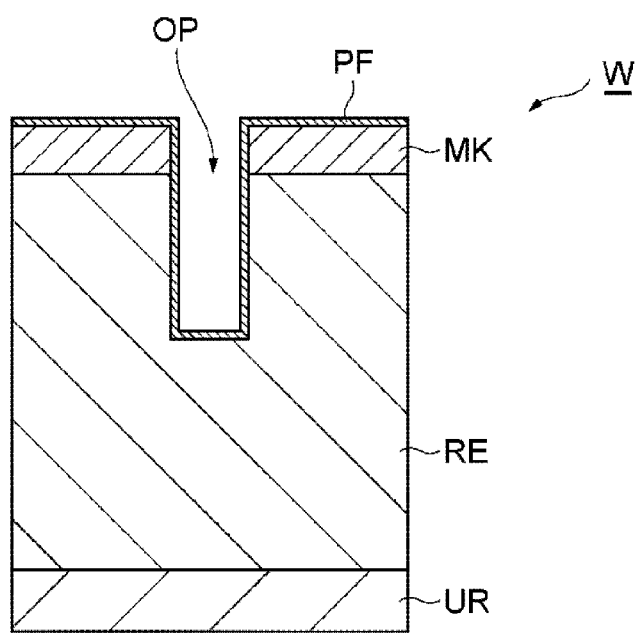
FIG. 7B is a partially enlarged cross-sectional view of the exemplary substrate after a film PF is formed.

In step ST1, a film PF is formed on the surface of the substrate W (see FIG. 7B). In step ST2, the region RE is etched. The film PF is made of the same material as the material of the region RE. The film PF is etched at the same time when the region RE is etched in step ST2. In an embodiment, an etching rate of the film PF in step ST2 is equal to or higher than an etching rate of the region RE, or equal to or lower than the etching rate of the region RE. Alternatively, the value obtained by dividing the etching rate of the film PF by the etching rate of the region RE may be 0.7 or more and 1.2 or less. The value obtained by dividing the etching rate of the film PF by the etching rate of the region RE may be 0.8 or more and 1.1 or less.

When the substrate W of the first example is processed, the region RE is made of a carbon-containing material. When the substrate W of the first example is processed, the film PF is made of, for example, fluorocarbon, hydrofluorocarbon, hydrocarbon, carbon, or boron-doped carbon. When the region RE is made of amorphous carbon or photoresist, the film PF may be made of boron-doped carbon. When the substrate W of any one of the second to seventh examples is processed, the film PF is made of a silicon-containing material. When the substrate W of the second or fifth example is processed, the film PF is made of, for example, silicon oxide (e.g., TEOS), SiOC, SiON, or silicon nitride. When the substrate W of the third example is processed, the film PF is made of, for example, silicon nitride, SiON, or silicon oxide. When the substrate W of the fourth example is processed, the film PF is made of, for example, polycrystalline silicon or amorphous silicon. When the substrate W of the sixth example is processed, the film PF is made of, for example, silicon oxide (e.g., TEOS), SiOC, SiON, silicon nitride, polycrystalline silicon, or amorphous silicon. When the substrate W of the sixth or seventh example is processed, the film PF is made of, for example, silicon oxide (e.g., TEOS), SiOC, SiON, silicon nitride, polycrystalline silicon, or amorphous silicon. When the region RE is made of silicon oxide formed using TEOS, or when the substrate W is made of a low-dielectric material (e.g., porous SiOCH) as in the eighth example of the substrate W, the film PF may be made of silicon oxide.

When the substrate W of any one of the first to eighth examples is processed, the film PF may be formed by a CVD method in step ST1. The CVD method may be a plasma (plasma enhanced) CVD method, or may be a CVD method using heat or light. In step ST1 by the CVD method, a film-forming gas is supplied into the chamber 10. In step ST1 by the CVD method, plasma may be generated from the film-forming gas in the chamber 10. Alternatively, in step ST13, a precursor in the film formation gas forming the film PF may be activated by heat or light.

In step ST1 by the CVD method, the controller 80 controls the gas supply GS to supply the film-forming gas into the chamber 10. Further, the controller 80 controls the exhaust device 50 to set the pressure in the chamber 10 to a designated pressure. In step ST1 by the CVD method, the controller 80 may control the plasma generator to generate plasma from the film-forming gas. Specifically, the controller 80 may control the radio-frequency power supply 61 and the bias power supply 62 to supply the radio-frequency power HF and/or the radio-frequency power LF. Alternatively, in step ST1 by the CVD method, the heater HT may be controlled to supply the film-forming gas into the chamber 10 and heat the substrate W for activation. Alternatively, in step ST13, the controller 80 may control a light source to irradiate the substrate W with light for activation.

When the substrate W of the first example is processed, the film-forming gas used in the step ST1 by the CVD method contains, for example, a fluorocarbon gas, a hydrofluorocarbon gas, CO gas, or a hydrocarbon gas (e.g., $CH_4$ gas, $C_3H_6$ gas, or $C_2H_4$ gas). In step ST1, the film-forming gas may further contain a rare gas such as Ar gas and/or $N_2$ gas.

When the substrate W of the second or third example is processed, the film-forming gas used in the step ST1 by the CVD method contains a silicon-containing gas. The film-forming gas further contains an oxygen-containing gas and/or a nitrogen-containing gas. The film-forming gas may contain, for example, $SiCl_4$ gas and $O_2$ gas. Alternatively, the film-forming gas may contain, for example, $Si_2Cl_6$ gas and $NH_3$ gas.

When the substrate W of the fourth example is processed, the film-forming gas used in the step ST1 by the CVD method contains monosilane ($SiH_4$), disilane ($Si_2H_6$), silicon chloride, chlorosilan, or silicon fluoride. Examples of silicon chloride include silicon tetrachloride ($SiCl_4$) and hexachlorodisilane ($Si_2Cl_6$). Examples of chlorosilane include trichlorosilane ($HSiCl_3$), dichlorosilane ($H_2SiCl_2$), and chlorotrimethylsilane (($CH_3)_3SiCl$). Examples of silicon fluoride include silicon tetrafluoride ($SiF_4$) The film-forming gas may contain hydrogen (e.g., $H_2$) and/or a rare gas (e.g., Ar or He).

When the substrate W of the fifth example is processed, the film-forming gas used in step ST1 by the CVD method is the same as the film-forming gas used in step ST1 in the second or third example of the substrate W. When the substrate W of the sixth or eighth example is processed, the film-forming gas used in step ST1 by the CVD method is the same as the film-forming gas used in step ST1 in the second or fourth example of the substrate W. When the substrate W of the seventh example is processed, the film-forming gas used in step ST1 by the CVD method is the same as the film-forming gas used in step ST1 in the second, third, or fourth example of the substrate W.

When the substrate W of the fourth example is processed, in step ST1, the film PF is a physical vapor deposition (PVD) method. In this case, an inert gas is supplied into the chamber 10. The inert gas is, for example, a rare gas. In addition, plasma is generated from the inert gas in the chamber 10. In addition, a negative DC voltage is applied to the upper electrode 30. As a result, cations from the plasma collide with the top plate 34, and silicon is released from the top plate 34. The silicon released from the top plate 34 is deposited on the surface of the substrate W and forms the region RE.

In step ST1 by the PVD method, the controller 80 controls the gas supply GS to supply the inert gas into the chamber 10. Further, the controller 80 controls the exhaust device 50 to set the pressure in the chamber 10 to a designated pressure. In step ST1 by the PVD method, the controller 80 may control the plasma generator to generate plasma from the inert gas. Specifically, the controller 80 may control the radio-frequency power supply 61 and the bias power supply 62 to supply the radio-frequency power HF and/or the radio-frequency power LF. In step ST1 by the PVD method, the controller 80 controls the DC power supply device 64 to apply a negative DC voltage to the upper electrode 30.

Figure 6:
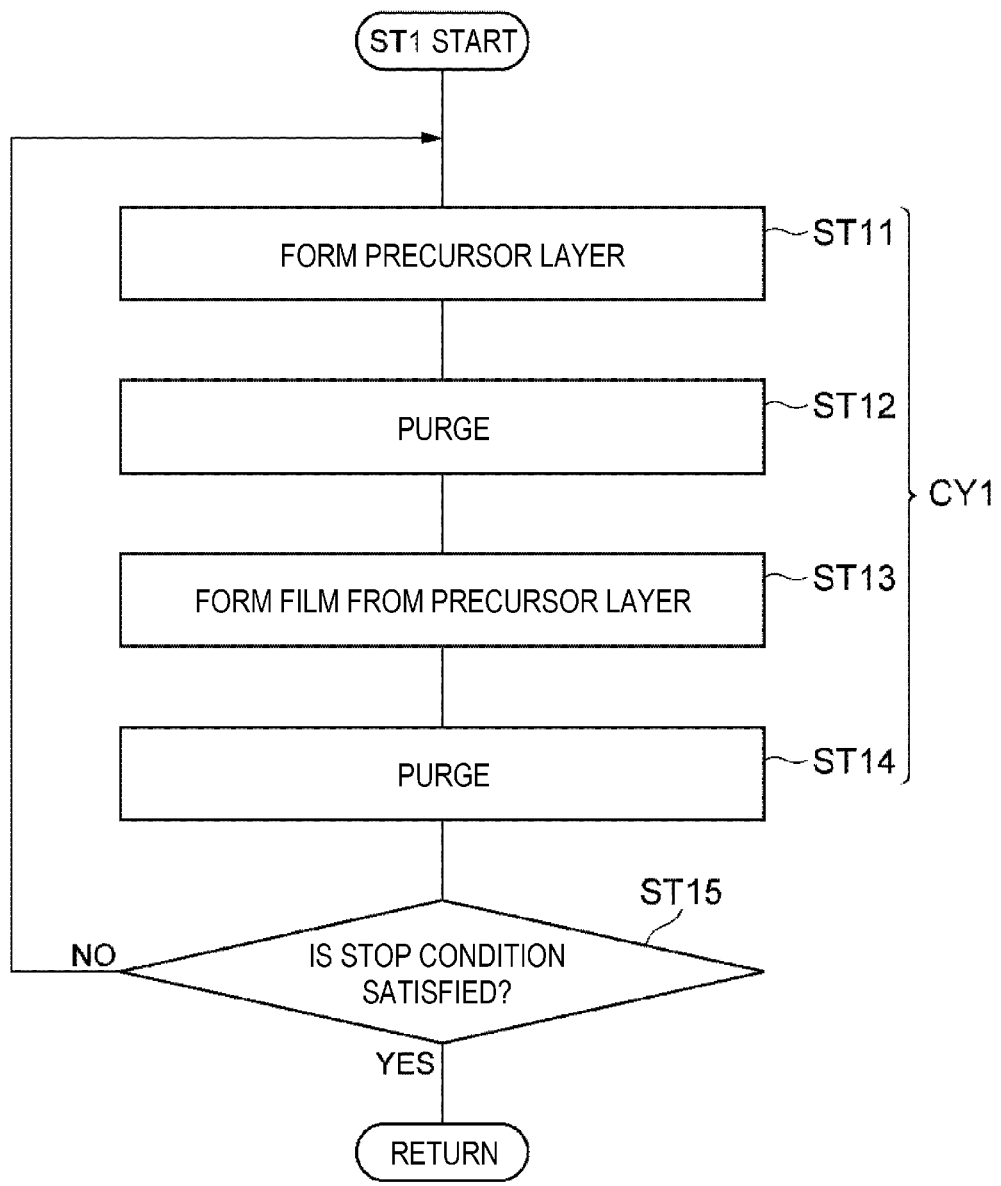
FIG. 6 is a flowchart of a film formation method which may be used in the etching method according to the embodiment.

When the substrate W of any one of the first to eighth examples is processed, in step ST1, the film PF may be formed by the film formation method illustrated in FIG. 6. FIG. 6 is a flowchart of a film formation method which may be used in the etching method according to the embodiment. Hereinafter, reference will be made to FIGS. 7A and 7B together with FIG. 6. FIG. 7A is a partially enlarged cross-sectional view of the exemplary substrate after a precursor layer is formed. FIG. 7B is a partially enlarged cross-sectional view of the exemplary substrate after a film PF is formed.

In an embodiment, as illustrated in FIG. 6, step ST1 includes steps ST11 and ST13. Step ST1 may further include step ST12 and step ST14. Step ST12 is performed between step ST11 and step ST13. Step ST14 is performed between step ST13 and step ST11.

In step ST11, as illustrated in FIG. 7A, a precursor layer PC is formed on the surface of the substrate W. In step ST11, a first gas is used for forming the precursor layer PC. The first gas contains a material constituting the precursor PC. In step ST11, the precursor layer PC may be formed without generating plasma from the first gas. Alternatively, in step ST11, the precursor layer PC may be formed using chemical species from the plasma generated from the first gas.

When the substrate W of the first example is processed, the first gas contains, for example, carboxylic acid, carboxylic acid halide, carboxylic anhydride, or an isocyanate. When the substrate W of any one of the second, third, fifth, sixth, seventh, and eighth examples is processed, the first gas contains, for example, aminosilane. The first gas may contain $Si_2Cl_6$ instead of aminosilane. When the substrate W of the fourth example is processed, the first gas contains monosilane ($SiH_4$), disilane ($Si_2H_6$), silicon chloride, chlorosilan, or silicon fluoride. Examples of silicon chloride include silicon tetrachloride ($SiCl_4$) and hexachlorodisilane ($Si_2Cl_6$). Examples of chlorosilane include trichlorosilane ($HSiCl_3$), dichlorosilane ($H_2SiCl_2$), and chlorotrimethylsilane (($CH_3$)$_3$SiCl). Examples of silicon fluoride include silicon tetrafluoride ($SiF_4$)

In step ST11, the controller 80 controls the gas supply GS to supply the first gas into the chamber 10. In step ST11, the controller 80 controls the exhaust device 50 to set the pressure of the gas in the chamber 10 to a designated pressure. When plasma is generated in step ST11, the controller 80 controls the plasma generator to generate plasma from the first gas in the chamber 10. In an embodiment, the controller 80 controls the radio-frequency power supply 61 and/or the bias power supply 62 to supply the radio-frequency power HF and/or the radio-frequency power LF.

In step ST12, purging of the internal space 10s is performed. In step ST12, the controller 80 controls the exhaust device 50 to exhaust the internal space 10s. In step ST12, the controller 80 controls the gas supply GS to supply the inert gas into the chamber 10. By performing step ST12, the first gas in the chamber 10 may be replaced with an inert gas. By performing step ST12, excess substances adsorbed on the substrate W may be removed. By performing step ST11 and step ST12, the precursor layer PC may be formed as a monomolecular layer on the substrate W.

In step ST13, as illustrated in FIG. 7B, a film PF is formed from the precursor layer PC. In step ST13, a second gas may be used for forming the film PF. The second gas contains reaction species that form the film PF from the precursor layer PC by reacting with a substance constituting the precursor layer PC. In step ST13, the film PF may be formed without generating plasma from the second gas. Alternatively, in step ST13, the film PF may be formed using chemical species from the plasma generated from the second gas. Alternatively, in step ST13, the precursor layer PC may be activated by heat or light.

When the substrate W of the first example is processed, the second gas contains, for example, a compound having an NH group or a compound having a hydroxyl group. Examples of the compound having an NH group include amine, $NH_3$, $N_2H_2$, or $N_2H_4$. When the substrate W of any one of the second, third, fifth, sixth, seventh, and eighth examples is processed, the second gas contains, for example, an oxygen-containing gas or nitrogen-containing gas. The oxygen-containing gas is, for example, $O_2$. The nitrogen-containing gas is, for example, $NH_3$. When the substrate W of the fourth example is processed, the second gas contains a hydrogen-containing gas (e.g., $H_2$ gas).

In step ST13, the controller 80 controls the gas supply GS to supply the second gas into the chamber 10. In step ST13, the controller 80 controls the exhaust device 50 to set the pressure of the gas in the chamber 10 to a designated pressure. When plasma is generated in step ST13, the controller 80 controls the plasma generator to generate plasma from the second gas in the chamber 10. In an embodiment, the controller 80 controls the radio-frequency power supply 61 and/or the bias power supply 62 to supply the radio-frequency power HF and/or the radio-frequency power LF. Alternatively, in step ST13, the controller 80 may control a heater HT to heat the substrate W for activation of the precursor layer PC. Alternatively, in step ST13, the controller 80 may control a light source to irradiate the substrate W with light for activation of the precursor layer PC.

In step ST14, purging of the internal space 10s is performed. Step ST14 is the same step as step ST12. By performing step ST14, the second gas in the chamber 10 may be replaced with an inert gas.

In step ST1, a plurality of film forming cycles CY1 each including step ST11 and step ST13 may be repeated in order. Each of the plurality of film forming cycles CY1 may further include step ST12 and step ST14. The thickness of the film PF may be adjusted by the number of repetitions of the film forming cycle CY1. When the film forming cycle CY1 is repeated, it is determined in step ST15 whether or not a stop condition is satisfied. The stop condition is satisfied when the number of performance of the film forming cycle CY1 has reached a predetermined number. When it is determined in step ST15 that the stop condition is not satisfied, the film forming cycle CY1 is performed again. When it is determined in step ST15 that the stop condition is satisfied, the performance of step ST1 ends, and the process proceeds to step ST2 as illustrated in FIG. 1.

Step ST2 is performed after the film PF is formed on the substrate W in step ST1. In step ST2, the region RE is etched. In an embodiment, the region RE is etched by chemical species from the plasma. In step ST2, plasma P2 is generated from a processing gas in the chamber 10. The processing gas used in step ST2 may be the same as the processing gas used in step STa.

Figure 8A:
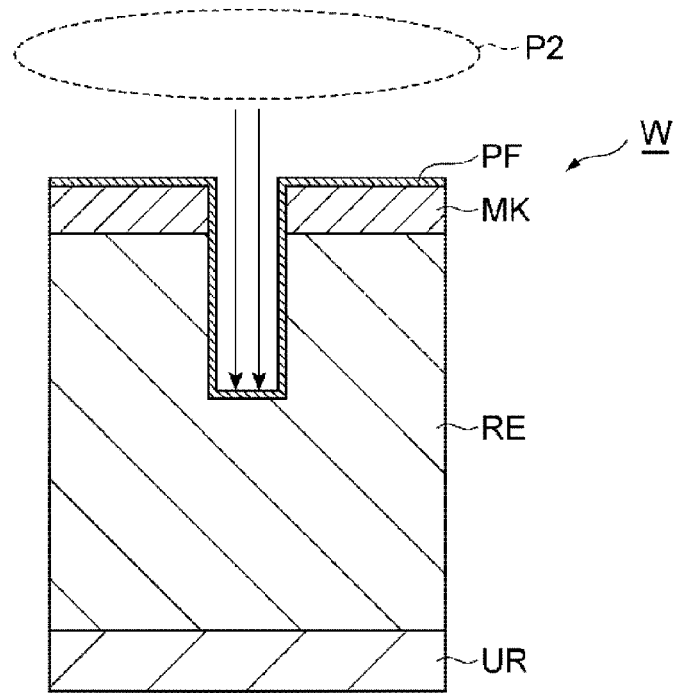
FIG. 8A is a view for explaining step ST2 of the etching method illustrated in FIG. 1.
Figure 8B:
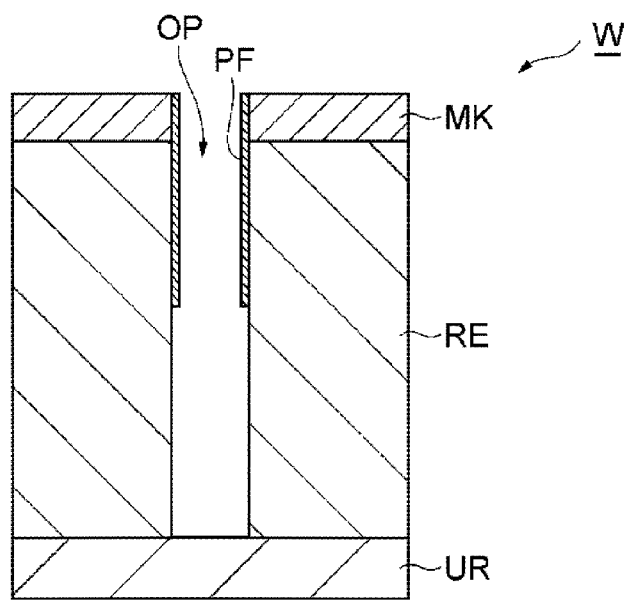
FIG. 8B is a partially enlarged cross-sectional view of the exemplary substrate after step ST2 is performed.

FIG. 8A is a view for explaining step ST2 of the etching method illustrated in FIG. 1, and FIG. 8B is a partially enlarged cross-sectional view of the exemplary substrate after step ST2 is performed. In step ST2, as illustrated in FIG. 8A, chemical species from the plasma P2 are irradiated to the region RE, so that the region RE is etched by the chemical species. As a result of the performance of step ST2, as illustrated in FIG. 8B, the depth of the opening OP is increased. The opening OP formed in the region RE may have an aspect ratio of 10 or more.

In step ST2, the controller 80 controls the exhaust device 50 to set the pressure of the gas in the chamber 10 to a designated pressure. In step ST2, the controller 80 controls the gas supply GS to supply the processing gas into the chamber 10. In step ST2, the controller 80 controls the plasma generator to generate plasma from the processing gas. In step ST2 in an embodiment, the controller 80 controls the radio-frequency power supply 61 and the bias power supply 62 to supply the radio-frequency power HF and the bias power BP. In step ST2, only one of the radio-frequency power HF and the radio-frequency power LF may be supplied to generate the plasma.

In the method MT, a plurality of cycles CY each including step ST1 and step ST2 may be repeated in order. When the plurality of cycles CY are performed in order, it is determined in step ST3 whether or not the stop condition is satisfied. The stop condition is satisfied when the number of performance of the cycle CY has reached a predetermined number. When it is determined in step ST3 that the stop condition is not satisfied, the cycle CY is performed again. When it is determined in step ST3 that the stop condition is satisfied, the performance of the method MT ends.

The film PF formed on the substrate W protects the mask MK at the start of etching of the region RE in step ST2. Therefore, substances released from the mask MK when the mask MK is etched may be suppressed from being reattached to the mask MK so that the opening OP is blocked. Alternatively, when a gas forming deposits on the mask MK is used as an etching gas to protect the mask MK, excess deposits may be suppressed from blocking the opening OP. Further, since the film PF protects the side wall surface formed in the region RE, it is possible to suppress the opening OP formed in the region RE from expanding in the lateral direction due to etching in step ST2.

Further, since the region RE is etched in step ST2 after the film PF is formed, the start of the etching of the mask MK is delayed in step ST2. Therefore, in the method MT, the selection ratio of the etching of the region RE to the etching of the mask MK is enhanced.

The condition of step ST1 for forming the film PF in at least one of the plurality of cycles CY may be different from the condition of step ST1 for forming the film PF in at least one other cycle of the plurality of cycles CY. The conditions of step ST1 for all cycles CY may be different from each other. In this case, the film PF may be formed in each cycle such that its thickness or coverage is different from the thickness or coverage of the film PF formed in other cycles.

The condition of step ST2 for etching the region RE in at least one of the plurality of cycles CY may be different from the condition of step ST2 for etching the region RE in at least one other cycle of the plurality of cycles CY. The conditions of step ST2 for all cycles CY may be different from each other. In this case, the region RE may be etched in each cycle such that its etching amount is different from the etching amount of the region RE in other cycles.

In each of the plurality of cycles CY, the condition for forming the film PF in one of the plurality of film forming cycles CY1 may be different from the condition for forming the film PF in at least one other film forming cycle of the plurality of film forming cycles CY1. That is, in each of the plurality of cycles CY, the condition of step ST11 and/or the condition of step ST13 in one film forming cycle may be different from the condition of step ST11 and/or the condition of step ST13 in at least one other film forming cycle. In each of the plurality of cycles CY, the conditions for forming the film PF in all the film forming cycles CY1 may be different from each other. In this case, the thickness distribution of the film PF may be controlled by each of the plurality of film forming cycles CY1 included in each of the plurality of cycles CY.

Figure 9A:
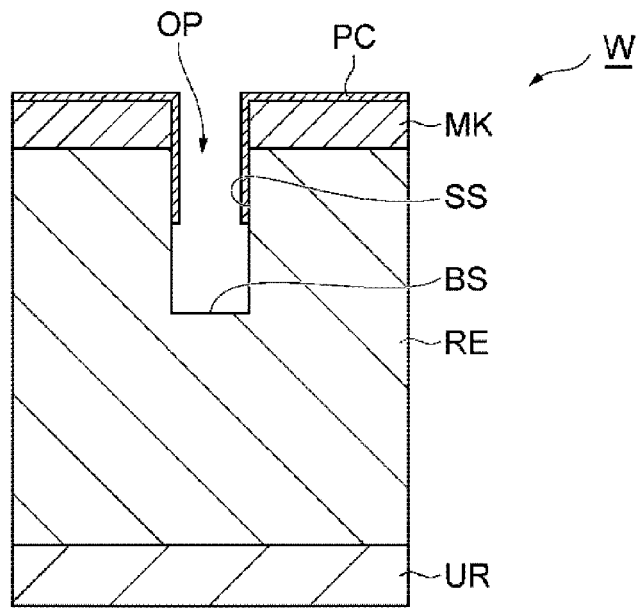
FIG. 9A is a partially enlarged cross-sectional view of the exemplary substrate after a precursor layer is formed.
Figure 9B:
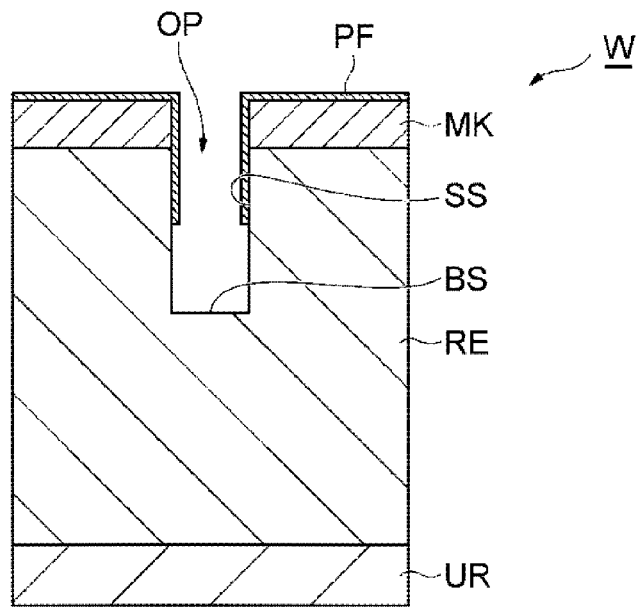
FIG. 9B is a partially enlarged cross-sectional view of the exemplary substrate after a film is formed.

Hereinafter, reference will be made to FIGS. 9A and 9B. FIG. 9A is a partially enlarged cross-sectional view of the exemplary substrate after a precursor layer is formed, and FIG. 9B is a partially enlarged cross-sectional view of the exemplary substrate after a film is formed. In an embodiment, as illustrated in FIG. 9B, the film PF may cover an upper surface in the substrate W. The upper surface in the substrate W includes the surface of the mask MK. The upper surface in the substrate W does not include a bottom surface BS defining the opening OP. The upper surface in the substrate W may not further include a region in the vicinity of the bottom surface BS in a side surface SS defining the opening OP. Alternatively, in an embodiment, the thickness of the film PF may have a distribution that varies with position. For example, the film PF may be formed such that its thickness decreases according to the depth in the substrate W from the upper end of the substrate W. More specifically, the thickness of the film PF may be large near the upper end of the opening OP and small or zero near the deep part of the opening OP. By using the film PF having such a thickness distribution, it is possible to suppress the width of the opening OP from becoming narrower on the bottom side thereof. The film PF having such a thickness distribution may be formed by the method of forming the film PF described below or the CVD method described above.

In order to form the film PF illustrated in FIG. 9B, in step ST11, the precursor layer PC covers the surface of the mask MK, but may be formed so as not to cover the entire surface of the substrate W, as illustrated in FIG. 9A. In order to form the precursor layer PC in this way, at least one of the conditions (1) to (5) is satisfied in step ST11. Under the condition (1), the pressure of the gas in the chamber 10 during the performance of step ST11 is set to be lower than the pressure at which the substance forming the precursor layer PC is adsorbed on the entire surface of the substrate W, when the other processing conditions are the same. Under the condition (2), the processing time of step ST11 is set to be shorter than the processing time in which the substance forming the precursor layer PC is adsorbed on the entire surface of the substrate W, when the other processing conditions are the same. Under the condition (3), the dilution of the substance forming the precursor layer PC in the first gas is set to a value higher than the dilution of the substance forming the precursor layer PC adsorbed on the entire surface of the substrate W, when the other processing conditions are the same. Under the condition (4), the temperature of the substrate supporter 16 during the performance of step ST11 is set to a temperature lower than the temperature at which the substance forming the precursor layer PC is adsorbed on the entire surface of the substrate W, when the other processing conditions are the same. The condition (5) may be applied when plasma is generated in step ST11. Under the condition (5), the absolute value of the radio-frequency power (radio-frequency power HF and/or radio-frequency power LF) is set to a value smaller than the absolute value in which the substance forming the precursor layer PC is adsorbed on the entire surface of the substrate W, when the other processing conditions are the same.

In order to form the film PF illustrated in FIG. 9B, at least one of the conditions (1) to (5) may be satisfied in step ST13. Under the condition (1), the pressure of the gas in the chamber 10 during the performance of step ST13 is set to be lower than the pressure at which the reaction between the substance in the second gas and the substance forming the precursor layer PC is completed in the entire precursor layer PC, when the other processing conditions are the same. Under the condition (2), the processing time of step ST13 is set to be shorter than the processing time in which the reaction between the substance in the second gas and the substance forming the precursor layer PC is completed in the entire precursor layer PC, when the other processing conditions are the same. Under the condition (3), the dilution of the substance forming the film PF in the second gas is set to a value higher than the dilution at which the reaction between the substance in the second gas and the substance forming the precursor layer PC is completed in the entire precursor layer PC, when the other processing conditions are the same. Under the condition (4), the temperature of the substrate supporter 16 during the performance of step ST13 is set to a temperature lower than the temperature at which the reaction between the substance in the second gas and the substance forming the precursor layer PC is completed in the entire precursor layer PC, when the other processing conditions are the same. The condition (5) may be applied when plasma is generated in step ST13. Under the condition (5), the absolute value of the radio-frequency power (radio-frequency power HF and/or radio-frequency power LF) is set to a value smaller than the absolute value in which the reaction between the substance in the second gas and the substance forming the precursor layer PC is completed in the entire precursor layer PC, when the other processing conditions are the same.

Figure 10:
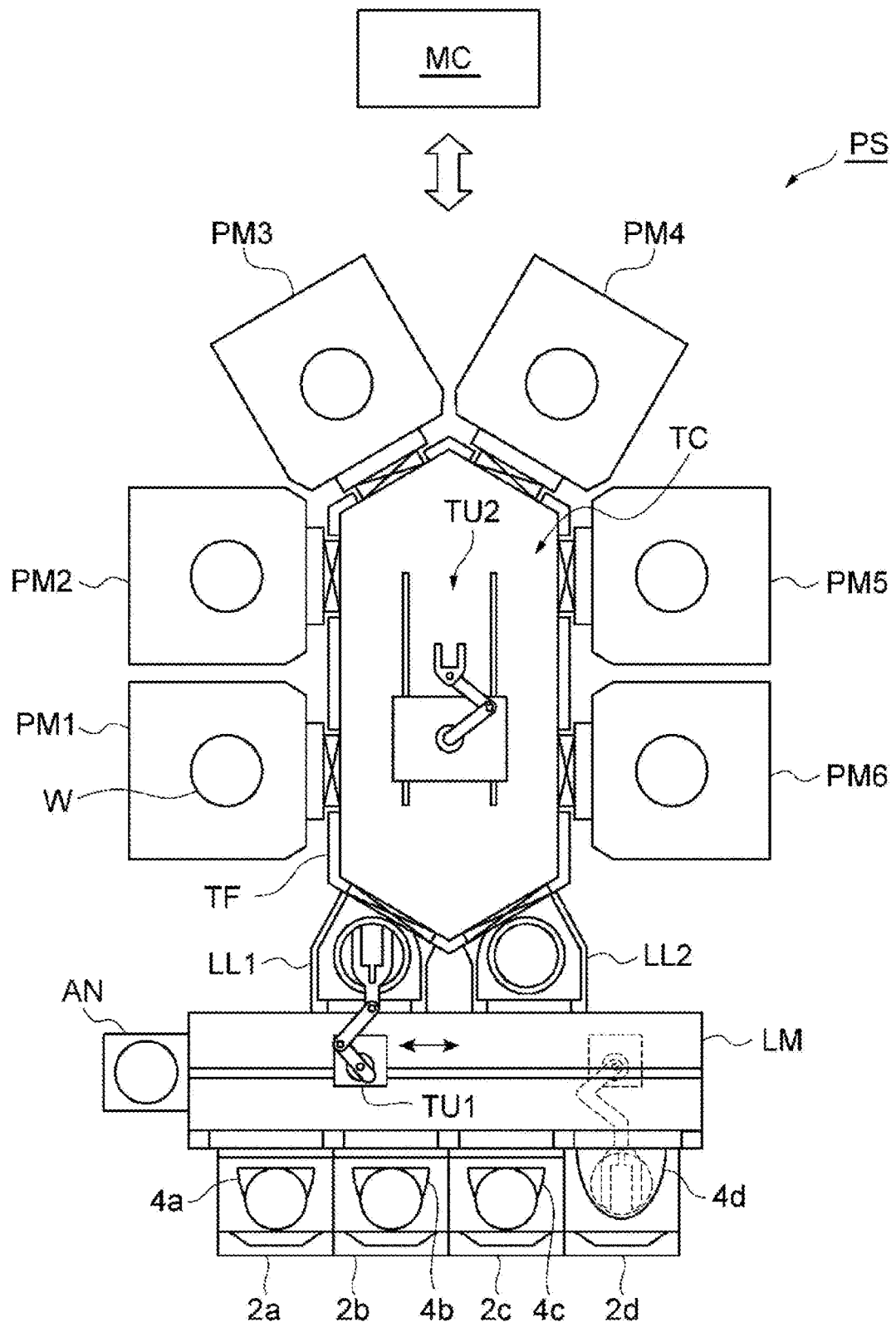
FIG. 10 is a view illustrating a substrate processing system according to an embodiment.

Hereinafter, reference will be made to FIG. 10. The method MT may be performed using a substrate processing system that includes a film forming apparatus and a substrate processing apparatus. FIG. 10 is a view illustrating a substrate processing system according to an embodiment. The substrate processing system PS illustrated in FIG. 10 may be used to perform the method MT.

The substrate processing system PS includes bases 2a to 2d, containers 4a to 4d, a loader module LM, an aligner AN, load lock modules LL1 and LL2, process modules PM1 to PM6, a transfer module TF, and a controller MC. The number of bases, the number of containers, and the number of load lock modules in the substrate processing system PS may be any number of one or more. In addition, the number of process modules in the substrate processing system PS may be any number of two or more.

The bases 2a to 2d are arranged along one edge of the loader module LM. The containers 4a to 4d are mounted on the bases 2a to 2d, respectively. Each of the containers 4a to 4d is, for example, a container called FOUP (front opening unified pod). Each of the containers 4a to 4d is configured to accommodate the substrate W therein.

The loader module LM includes a chamber. The pressure in the chamber of the loader module LM is set to an atmospheric pressure. The loader module LM includes a transfer device TU1. The transfer device TU1 is, for example, an articulated robot and is controlled by the controller MC. The transfer device TU1 is configured to transfer the substrate W through the chamber of the loader module LM. The transfer device TU1 may transfer the substrate W between each of the containers 4a to 4d and the aligner AN, between the aligner AN and each of the load lock modules LL1 and LL2, between each of the load lock modules LL1 and LL2 and each of the containers 4a to 4d. The aligner AN is connected to the loader module LM. The aligner AN is configured to adjust (calibrate) the position of the substrate W.

Each of the load lock modules LL1 and LL2 is provided between the loader module LM and the transfer module TF. Each of the load lock modules LL1 and LL2 provides a preliminary decompression chamber.

The transfer module TF is connected to each of the load lock modules LL1 and LL2 via a gate valve. The transfer module TF includes a pressure-reducible transfer chamber TC. The transfer module TF includes a transfer device TU2. The transfer device TU2 is, for example, an articulated robot and is controlled by the controller MC. The transfer device TU2 is configured to transfer the substrate W through the transfer chamber TC. The transport device TU2 may transfer the substrate W between each of the load lock modules LL1 and LL2 and each of the process modules PM1 to PM6, and between any two process modules of the process modules PM1 to PM6.

Each of the process modules PM1 to PM6 is an apparatus configured to perform a dedicated substrate processing. One of the process modules PM1 to PM6 is a film forming apparatus. The film forming apparatus is used to form the film PF in step ST1. Therefore, this film forming apparatus is an apparatus configured to perform step ST1 by the above-mentioned film forming method. This film forming apparatus may be a plasma processing apparatus such as the plasma processing apparatus 1 or another plasma processing apparatus when plasma is generated in step ST1. When the film PF is formed without generating plasma in step ST1, the film forming apparatus does not have to have a configuration for generating plasma.

Another process module among the process modules PM1 to PM6 is a substrate processing apparatus such as a plasma processing apparatus 1 or another plasma processing apparatus. The substrate processing apparatus is used to etch the region RE in step ST2. The substrate processing apparatus may be used for etching in step STa. Alternatively, the etching in step STa may be performed using a substrate processing apparatus which is yet another process module of the process modules PM1 to PM6.

In the substrate processing system PS, the controller MC is configured to control each unit of the substrate processing system PS. The controller MC controls the film forming apparatus to form the film PF in step ST1. The controller MC controls the substrate processing apparatus to etch the region RE after the film PF is formed. The substrate processing system PS may transfer the substrate W between the process modules without bringing the substrate W into contact with the atmosphere.

Although various embodiments have been described above, the present disclosure is not limited to the embodiments described above, and various omissions, substitutions, and modifications may be made. Further, it is possible to combine the elements in different embodiments to form other embodiments.

For example, the substrate processing apparatus used to perform the method MT may be any type of plasma processing apparatus. For example, the substrate processing apparatus used to perform the method MT may be a capacitively coupled plasma processing apparatus other than the plasma processing apparatus 1. The substrate processing apparatus used to perform the method MT may be an inductively coupled plasma processing apparatus, an electron cyclotron resonance (ECR) plasma processing apparatus, or a plasma processing apparatus that uses a surface wave such as a microwave for plasma generation. Further, in the method MT, the substrate processing apparatus may not have a plasma generator when plasma is not used.

According to an embodiment, it is possible to suppress blockage of an opening of a mask in etching a region in the substrate.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An etching method, comprising:
    (a) forming a film on a surface of a substrate, wherein the substrate includes layer to be etched and a mask, the mask is provided on the layer and in direct contact with the layer, the film is formed directly on a top surface of the mask so that the mask is between the film and the layer, the mask includes an opening that partially exposes the layer, the layer has an opening having a first depth, and the film is made of a same material as that of the layer; and
    (b) etching the layer after the forming the film to etch the layer to a second depth deeper into the layer than the first depth.

2. The etching method according to claim 1, wherein during the etching the layer, an etching rate of etching the film divided by an etching rate of etching the layer is from 0.7 to 1.2.

3. The etching method according to claim 1, wherein the layer is made of an organic material.

4. The etching method according to claim 1, wherein the layer is made of silicon oxide or silicon nitride.

5. The etching method according to claim 1, wherein the layer includes a plurality of layers made of two or more materials from silicon oxide, silicon nitride, and polycrystalline silicon, respectively.

6. The etching method according to claim 1, wherein the layer is made of silicon, germanium, or both silicon and germanium.

7. The etching method according to claim 6, wherein the film is made of amorphous silicon.

8. The etching method according to claim 1, wherein the layer is made of a low-dielectric material.

9. The etching method according to claim 1, further comprising:
    during the forming the film or prior to the forming the film, partially etching into a depth of the layer; and
    after the forming the film, further etching the layer in (b) to increase the depth of an opening in the layer.

10. The etching method according to claim 1, wherein the forming of the film includes:
    forming a precursor layer on the substrate by supplying a first gas to the substrate; and
    forming the film on the substrate from the precursor layer either by supplying a second gas to the precursor layer or by activating the precursor layer.

11. The etching method according to claim 10, wherein the film is formed using chemical species from plasma generated from the second gas.

12. The etching method according to claim 1, wherein the film is formed by chemical vapor deposition (CVD).

13. The etching method according to claim 1, wherein the film is formed such that a thickness thereof decreases along a depth in the substrate from a top edge of the substrate.

14. The etching method according to claim 1, wherein prior to the forming the film, the opening of the mask has a width which is 100 nm or less.

15. The etching method according to claim 1, further comprising alternately repeating (a) and (b).

16. The etching method according to claim 1, wherein the forming the film includes forming the film on sidewalls of the opening of the mask, and on sidewalls and a bottom of the opening of the layer having the first depth.

17. An etching method, comprising:
    providing a substrate having a layer to be etched and a mask on the layer and in direct contact with the layer, the mask having an opening which partially exposes the layer, the layer having an opening having a first depth, the substrate further including an underlying layer below the layer, with the underlying layer being composed of a different material than a material of the layer:
    forming a film on a top surface of the mask so that the mask is between the film and layer, the film being formed on at least one of a side wall of the opening of the mask or a portion of the layer exposed through the mask, and the film includes a same material as the material of the layer; and
    after the forming the film, etching the layer through the opening in the mask to etch the layer to a second depth deeper into the layer than the first depth.

18. The etching method according to claim 17, further comprising:
    prior to the forming the film, partially etching the layer through the opening in the mask to etch the first depth in the layer.

19. The etching method according to claim 18, wherein the forming the film includes forming the film on sidewalls of the opening of the mask and on sidewalls of an opening of the layer etched during the etching prior to the forming the film, and
    the etching of the layer after forming of the film exposes the underlying layer.

20. The etching method according to claim 18, wherein during the etching the layer, an etching rate of etching the film divided by an etching rate of etching the layer is from 0.7 to 1.2.

* * * * *